United States Patent
Augesky et al.

(10) Patent No.: US 9,966,845 B2
(45) Date of Patent: May 8, 2018

(54) POWER SUPPLY UNIT HAVING OUTPUTS THAT CAN BE CONNECTED IN PARALLEL

(71) Applicant: Siemens Aktiengesellschaft, Munich (DE)

(72) Inventors: Christian Augesky, Vienna (AT); Harald Schweigert, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 946 days.

(21) Appl. No.: 14/376,909

(22) PCT Filed: Jan. 14, 2013

(86) PCT No.: PCT/EP2013/050562
§ 371 (c)(1),
(2) Date: Aug. 6, 2014

(87) PCT Pub. No.: WO2013/117384
PCT Pub. Date: Aug. 15, 2013

(65) Prior Publication Data
US 2015/0008892 A1    Jan. 8, 2015

(30) Foreign Application Priority Data
Feb. 6, 2012    (EP) .................................... 12153967

(51) Int. Cl.
*H02J 1/10* (2006.01)
*H02M 3/158* (2006.01)
*G01R 31/02* (2006.01)

(52) U.S. Cl.
CPC ............. *H02M 3/158* (2013.01); *H02J 1/102* (2013.01); *G01R 31/026* (2013.01); *Y10T 307/707* (2015.04)

(58) Field of Classification Search
CPC ........ Y10T 307/707; Y10T 307/549–307/609; H02J 1/102
See application file for complete search history.

(56) References Cited

U.S. PATENT DOCUMENTS

2006/0119992 A1    6/2006  Pearce
2011/0018580 A1    1/2011  Sudo
2014/0319915 A1*  10/2014  Lee ........................... H02J 1/10
                                                            307/52

FOREIGN PATENT DOCUMENTS

CN    201656474       11/2010
DE    19704662 A1    8/1998
(Continued)

OTHER PUBLICATIONS

CN104081613B, English Language Abstract Only. Apr. 26, 2017.*

*Primary Examiner* — Fritz M Fleming
(74) *Attorney, Agent, or Firm* — Cozen O'Connor

(57) ABSTRACT

A power supply unit comprises at least one first converter unit and a second converter unit. The at least one first converter unit is controlled with a first controller and supplies at a first output at least one of a first output voltage that is regulated using a first voltage regulator and an output current that is regulated using a first current regulator. The second converter unit is controlled by a second controller and supplies at a second output at least one of an output voltage that is regulated using the second voltage regulator and an output current that is regulated using a second current regulator. The first and second outputs are connected in parallel for providing a higher output power, and at least one controller includes a supervision unit for recognizing an output-side parallel connection.

23 Claims, 11 Drawing Sheets

(56) References Cited

FOREIGN PATENT DOCUMENTS

EP 0158007 A1 10/1985
JP 2009232545 A 10/2009

* cited by examiner

POWER SUPPLY UNIT HAVING OUTPUTS THAT CAN BE CONNECTED IN PARALLEL

CROSS-REFERENCE TO RELATED APPLICATIONS

This is U.S. national stage of PCT Application No. PCT/EP2013/050562, filed on Jan. 14, 2013, which claims priority to European Patent Application No. EP 12153967.0, filed on Feb. 6, 2012, each of which is hereby incorporated in its entirety by reference.

FIELD OF INVENTION

The invention relates to a power supply unit comprising at least a first and a second converter unit. The first converter unit is controlled by a first controller and supplies a first output voltage regulated using a first voltage regulator and/or a first output current regulated using a first current regulator at a first output. The second converter unit is controlled by a second controller and supplies a second output voltage that is regulated using the second voltage regulator and/or a second output current that is regulated using a second current regulator at a second output. The first and second (voltage/current) outputs are connected in parallel to supply a higher output power. In addition, the invention relates to a method for operating such a power supply unit.

DESCRIPTION OF THE RELATED ART

The purpose of a power supply unit with a number of converter units is initially to supply power to a number of load branches. For this purpose, at least two converter units each having a regulated output voltage are provided. In many applications, it is necessary to supply a load requiring the amount of power that exceeds the output power of one converter unit. In order to make a higher output power available, two or more outputs are therefore connected in parallel. The sum of the powers of the outputs connected in parallel is then provided to supply a load. Various methods are known in order to avoid one converter unit being loaded to an increasing extent in such a parallel mode.

With clocked power supplies, it is possible to provide what is known as a hard parallel connection. In this case, the internal regulation circuits of each converter unit are set before the units are connected in parallel to a desired output voltage value and, if necessary, set to a desired current limiting value. During operation, the voltage converters, because of a limited setting accuracy and a natural drift, exhibit small differences in the desired voltage values. Therefore, as the load current increases the converter unit with the highest output voltage supplies the entire load until the appropriate current limit is reached. As a result, the output voltage of this converter unit collapses and the remaining parallel-switched converter units with a previously lower desired voltage value deliver current into the common output.

The disadvantage in this case is the cumbersome equalization process which has to be carried out by operating personnel. In addition, at part load there is no distribution of the load onto all parallel-connected converter units. This results in greater wear at that converter unit which delivers most of the power. This leads to an unequal ageing and conceals the risk of a premature system fault. Such hard parallel connection is not suitable for converter units which switch off entirely after a certain time in current limiting operating mode. After a switch-off process, the remaining converter units could no longer deliver the desired power and would likewise switch off.

Another known measure provides for a special characteristic of the output voltage regulator. In this case the output voltage is reduced as the current increases. This is referred to as a soft characteristic curve (See FIG. 1) of the corresponding converter unit. The reduction is selected so that on the one hand the tolerances of the output voltage predetermined by a connected load will not be exceeded. On the other hand the reduction must be high enough to amount to a multiple of the setting accuracy, the drift in operation, the ageing drift and the voltage drops of the circuitry cables up to the shared load. The effect described above during hard parallel connection also has a secondary influence.

Also disadvantageous is the complex adjustment by operating personnel, especially for output voltages which do not correspond to the original factory settings. First, a connection of the outputs must be disconnected. The output voltages of the individual voltage regulators must then be adjusted to one another to the new desired value with a predetermined maximum deviation, before the outputs could be connected to each other again.

If, instead of cabling with one common connection point, a looped cabling (daisy chain wiring) of the output is undertaken, the disadvantage associated with it is that the voltage drops on the cables which do not contribute to symmetrization. Instead, the opposite effect occurs since the first converter unit exhibits a greater cable resistance up to the load than the last converter unit. This cable resistance also leads, for output voltages of the individual converter units with very narrow tolerances, to a marked difference in the current output.

Power supplies which are used in electrotechnical laboratories generally have a number of regulated outputs. In such cases, two outputs can be connected in parallel. This is done using a switch which connects together both the power outputs and also the signaling paths of the internal controllers. The switch in such cases has a number of contacts and connects the controllers of the outputs in a manner such that a previously defined voltage and current regulator is valid for both outputs (See FIG. 2). Such a solution can only be used to a limited extent for power supplies in the industrial field. On the one hand the operating personnel could deliberately or accidentally connect the outputs in parallel using a connecting line, without actuating the switch. The symmetrization of the outputs then does not function.

On the other hand, with more than two outputs, only the two outputs which have a corresponding switch can be connected in parallel. In addition, such a switch in the industrial devices would be able to switch high direct currents and a number of signals, which is why only expensive special fabrications would be considered.

SUMMARY OF THE INVENTION

An underlying object of the invention, for a power supply unit of the type described above, is to specify an improvement compared to the prior art. In addition, a method for operating the power supply unit is to be specified.

This object is achieved through the claimed invention, including a power supply unit and a method for operating such power supply unit that describe different developments of the inventive solution.

In one embodiment, at least one controller includes a supervision unit for detecting an output-side parallel connection. The supervision unit is supplied with a detection signal which, with parallel-connected outputs, automatically changes its signal state. Both voltage regulators and/or current regulators, in the event of parallel connection being detected, are coupled by specifying desired voltage values or desired current values tailored to one another.

As soon as an output-side parallel connection occurs the power supply unit switches automatically into a symmetrization mode, without further intervention of the operating personnel. No adjustment work or other precautions are necessary. This advantage is particularly apparent if a load to be supplied needs a different output voltage from the original factory setting of the power supply unit. The operating personnel must then only set one desired voltage value and the desired voltage value for the second output changes automatically as soon as a parallel connection is in place. Even with the outputs already connected in parallel, by setting the output voltage of a converter unit defined as the lead, the voltage of all parallel-switched outputs can be changed as well, wherein the load distribution of the power components is always maintained.

Advantageously the desired voltage values are predetermined as a common desired voltage value. The same desired value is predetermined to the voltage converters of the two converter units, so that a complete symmetrization is produced. In the same manner it is advantageous for the desired current values to be predetermined as one common desired current value. For example, the desired current values in this case are derived by a switching transistor switch-on time of a converter unit embodied as a switching converter, without providing a separate current regulator.

In one embodiment, each controller includes a current regulator for regulating a current flowing via the assigned output. Each converter unit can then be loaded up to a maximum current and, in the event of an overload, limits the current to this value. In this case, it is advantageous for each current regulator to be subordinate to the coupled voltage regulators. The voltage regulators predetermine desired voltages matched to one another and the current regulators regulate the currents. More specifically, the respective voltage regulator of an output predetermines a desired value as a regulation deviation for the associated current regulator. A current source is then realized at the respective output. The output current of the current source has the effect of achieving the desired voltage value predetermined to the voltage regulator.

In one embodiment, one controller is configured as master and, on detection of a parallel connection, for the other controller as slave to take over the desired voltage and/or current values of the master. In this case, the controller provided as the slave advantageously comprises the supervision unit for detecting an output-side parallel connection. As soon as such a parallel circuit is detected, the slave controller takes over the desired values for the output voltage and/or the output current and, if necessary, for a maximum limitation current from the master controller.

In an alternative embodiment, one controller is configured as the master and, on detection of a parallel connection, for the other controller as slave to take over switch-on and/or switch-off times of the master. The two converter units embodied as switching converters are then operated with the same switch control signals. A controller program in a digital signal processing/processor (DSP) controller is thus greatly simplified.

To form a detection signal, it is advantageous if the two outputs are connected using a connection piece and if the connection piece is coupled mechanically to an electric auxiliary contact for influencing the detection signal. A signal present at the auxiliary contact thus automatically changes its signal state as soon as the connection piece is attached or removed.

In this case, the dimensions of the connecting piece and of the outputs are advantageously determined in such as way that only specific outputs are connected using the connecting piece in the event that there are more than two outputs. This measure ensures that only such outputs are connected to one another as can be checked using the supervision unit. In addition, it can be defined in advance which controller is configured as master and which controller as slave.

In one embodiment, the electric auxiliary contact is open or closed when the outputs are not connected. When the outputs are connected using the connecting piece, the electric auxiliary contact is closed or opened against its previous state. As soon as a connecting piece connects the two outputs, the electric auxiliary contact is necessarily influenced. A previously opened auxiliary contact is closed or a previously closed auxiliary contact is opened.

In one embodiment, an electromechanical actuation element is actuated when the outputs are connected using the connecting piece. Such an actuation element is for example a push button or a switch, which can be placed in a simple manner next to an output. More specifically, this actuation element is placed so that it is actuated at least once when the power connection is attached and removed from two or more outputs, or is actuated during the entire time that the power connection is in existence. Thus, a push switch can be used, which on insertion of a connecting piece is actuated and switched on once using a protrusion. Only on removal of the connecting piece is the press switch switched off by being actuated again.

In one embodiment, when the outputs are connected using the connecting piece, a mechanical or electromagnetic sensor is activated for influencing an auxiliary contact. As an alternative to detection using the connection piece, a higher-ranking controller is provided and includes a supervision unit for detecting an output-side parallel connection. The higher-ranking controller is connected to the controllers of the two converter units. It is, thus, guaranteed independently of the type of mechanical connection of the two outputs that a parallel connection of the outputs is safely detected.

In one embodiment, a method for operating a power supply unit has at least one first and one second converter unit, wherein the first converter unit is controlled by a first controller for output of an output voltage regulated using a first voltage regulator and/or for output of a first output current regulated using the first current regulator at a first output, the second converter unit is controlled using a second controller for output of an output voltage regulated using a second voltage regulator and/or for output of a second output current regulated using the second current regulator at a second output. The first and second (voltage/current) outputs are connected in parallel for providing a higher output power.

In this case, the at least one controller includes a supervision unit for detecting an output-side parallel connection, wherein the supervision unit is supplied with a detection signal which for parallel-connected outputs changes its signal state automatically and wherein, when a parallel connection is detected, desired voltage values or desired current values matched to one another are predetermined to both voltage regulators and/or current regulators.

In some embodiments, only desired current values are matched to one another and the voltage regulator of one converter unit is deactivated in parallel operation. Further improved (e.g., simplified) operation of the converter units makes it possible that only the switching times or switch-on or switch-off periods of the one converter unit are predetermined for the other converter unit. The desired values are matched to one another in an especially simplified manner in this way, because both converter units are necessarily operated with the same power. Such a method is especially applicable in an operating mode which is called current mode or discontinuous mode. In such operating mode, a choke of the respective converter unit is always completely discharged, whereby on switching back on, the current and thus the energy in the choke is only dependent on one input voltage and the inductance.

In one embodiment, when the two outputs are connected using a connecting piece, an auxiliary contact is opened or closed. To detect a parallel connection without connecting piece, a parallel connection of the outputs is checked during a start-up process of the power supply unit such that the first converter unit is first started up and that when this is done the output voltage is detected as the recognition signal at the output of the second converter unit. If the output voltage of the second converter unit is already increasing with the output voltage of the first converter unit, a parallel connection is recognized.

In some embodiments, the two output voltages can exhibit deviations, which are not higher than a predetermined tolerance range, for a predetermined period of time or as a function of a voltage level reached. This tolerance range takes into account at least the measurement accuracy of the voltage detection at the outputs and the voltage drops to be expected through the possible power connections predetermined in an operating guide.

In some embodiment, this method can be implemented with reduced complexity for more than two outputs such that a predetermined sequence of the start-up of the individual outputs is followed. The voltages at the outputs not yet started up are monitored to determine whether they are going along with the current start-up voltage. With this method, any given circuits can be recognized, even those with longer cables or high-resistance cables.

In order to also recognize a parallel connection during operation, it is of advantage for each converter unit to be activated using a current regulator, if in ongoing operation a current regulator has a briefly changed desired current value predetermined to it and if during this period the difference of the two output voltages is detected as a recognition signal. If the difference between the two output voltages remains below a threshold value despite specification of a changed desired current value, a parallel connection of the outputs is recognized.

In an alternative embodiment, on activation of each converter unit using a current regulator during ongoing operation, a converter unit is activated with a briefly changed desired current value and an actual current value of the other converter unit is detected as recognition signal during this period. A changed actual current value of the other converter unit indicates a parallel connection of the outputs in this case.

In some embodiments, detection of a parallel connection is produced if current is injected between the two outputs using an additional voltage source and if in this case the difference between the two output currents is detected as the recognition signal. If the output voltage difference remains below a predetermined threshold value, a parallel connection is present.

In one embodiment, each converter unit is activated using a current converter, and a desired current value is briefly specified to a converter unit so that the corresponding converter unit runs in pure current source mode. The voltage at the output of this converter unit is detected as the recognition signal. This method is performed if a parallel connection is assumed and a controller as slave takes over the voltage regulation of the master. The controller with briefly directly predetermined desired current value operates as a slave in this case. A parallel connection is present when the output voltage at the output of this converter unit also regulates to the value which the voltage regulator prespecifies to the master controller.

If on the other hand a voltage difference arises between the outputs, a parallel connection is not present and the slave immediately switches back to voltage regulation with its own desired voltage value. For the decision as to whether a voltage difference is present between the outputs, expediently a tolerance is taken into account. Only when this tolerance is exceeded does the switch transitioning back into the original state with decoupled regulators take place.

Advantageously, the directly predetermined desired current value corresponds to the desired current value of the other converter unit. This means that a simple check is possible as soon as a determination is made that the result that a parallel connection is present. The current regulator desired value of a master controller is briefly transmitted to the slave controller. This means that no complex regulation loops, which can give rise to a tendency to oscillate, need be taken into account. If the output voltages of the two converter units diverge in this checking mode, no parallel connection exists. If the output voltages remain at the same level, the assumption of a parallel connection is confirmed.

It is of advantage for the difference between the two output voltages to be detected as a continuous process and for a recognition process of a possible parallel connection of the two outputs to be initiated if this difference falls below a minimum value. It is thus ensured that a parallel connection is recognized immediately during operation of the power supply unit. In an alternative embodiment, a check is carried out at predetermined intervals as to whether a parallel connection is present.

In addition, it is advantageous for an internal output voltage to be detected at both converter units. When a parallel connection is recognized, it is also advantageous for the difference between these internal output voltages to be compared with a predetermined maximum value. If the maximum value is exceeded, there is a switching off of the power supply unit or an activation of a notification signal. A check is made with this method as to whether a connection is embodied as a low-resistance connection or a high-resistance connection between the outputs. A connection which is too high-resistance could lead to an impermissible heating up, which is why a switch off should take place. For supplying power to parts of the system with high availability requirements, it may make sense to continue to operate the power supply unit even in this case and to send an alarm to operating personnel using a notification signal.

BRIEF DESCRIPTION OF THE DRAWINGS

The invention will be explained below by way of examples which refer to the enclosed figures. The figures show the following schematic diagrams:

FIG. 16 shows a mechanical connection of two outputs using a connecting piece and an auxiliary contact in accordance with one embodiment of the present invention.

DETAILED DESCRIPTION OF THE PRESENTLY PREFERRED EMBODIMENTS

Figure 1:
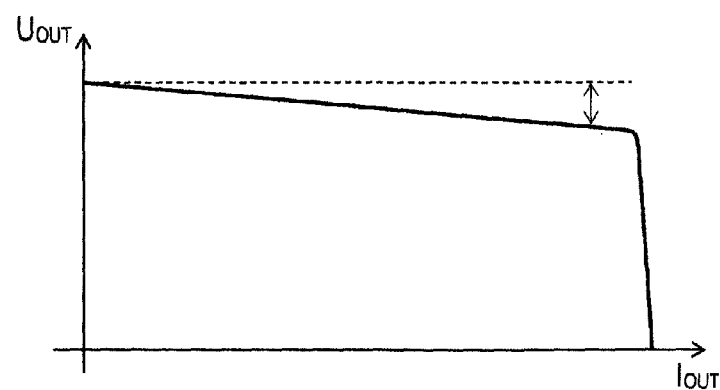
FIG. 1 shows a soft characteristic curve of a converter unit as known in the art.

As known in the art, converter units have a soft characteristic curve if a number of converter units are to be connected in parallel (FIG. 1). In such cases, the output voltage $U_{OUT}$ falls noticeably as the output current $I_{OUT}$ rises. The output voltage values of the converter units with parallel-connected outputs are adjusted to a common value. The deliberate drop in the output voltage $U_{OUT}$ for increasing current $I_{OUT}$ serves to compensate for adjustment tolerances, cable voltage drops etc.

Figure 2:
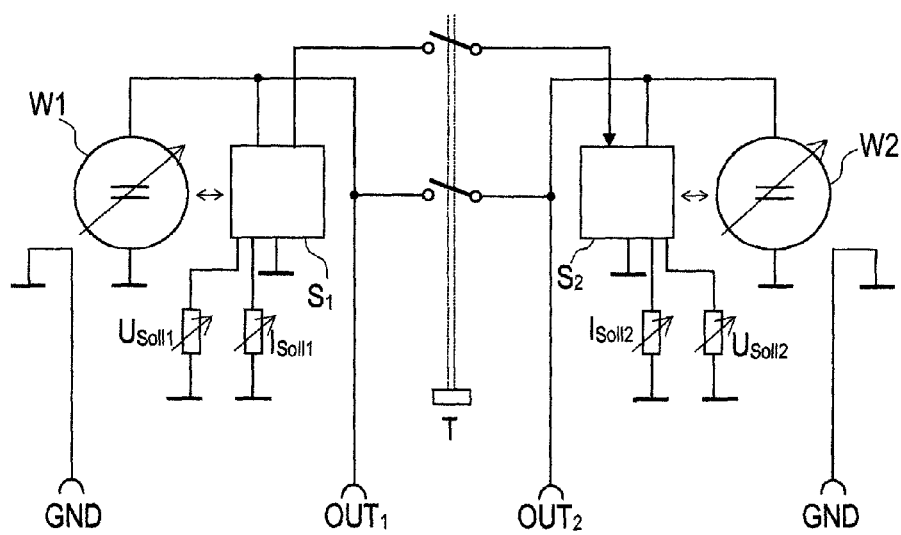
FIG. 2 shows two converter units with parallel connection option using push button as known in the art.

A known interconnection of two converter units W1, W2 is shown in FIG. 2. Each converter unit W1 or W2 delivers at an associated output $OUT_1$ or $OUT_2$ an adjustable output voltage in relation to ground GND. Each converter unit W1 or W2 is activated using a separate controller $S_1$ or $S_2$, wherein each controller $S_1$ or $S_2$ comprises a voltage regulator and a current regulator. Each controller $S_1$ or $S_2$ initially has its own desired voltage value $U_{Soll1}$ $U_{Soll2}$ and its own desired current value $I_{Soll1}$ or $I_{Soll2}$ predetermined to it.

The two outputs $OUT_1$ or $OUT_2$ are connected in parallel using a push button T. When connected in parallel using push button T, the two controllers $S_1$, $S_2$ are simultaneously connected together in such a way that one controller $S_2$ takes on the desired values $U_{Soll1}$ or $I_{Soll1}$ of the other controller $S_1$. The two converter units W1, W2 will thus be switched over to a parallel mode of operation by actuation of a push button T.

Figure 3:
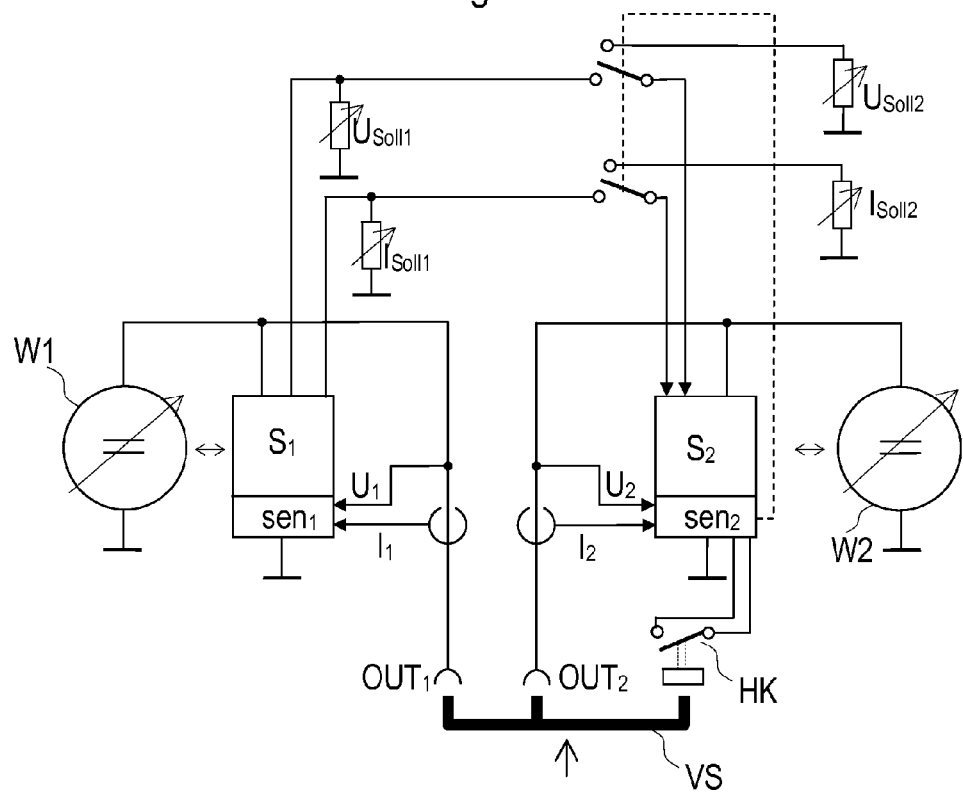
FIG. 3 shows two converter units with parallel connection option using a connecting piece in accordance with one embodiment of the present invention.

In one embodiment of the present invention, the connecting together of the two converter units W1, W2 is done using a connecting piece VS (FIG. 3). Each converter unit W1, W2, has a controller $S_1$ or S2 with a sensor unit $sen_1$ or $sen_2$ in each case. Using the respective sensor unit $sen_1$ or $sen_2$ there is ongoing detection of the output-side voltage $U_1$ or $U_2$ and of the current $I_1$ or $I_2$.

Its own desired voltage value $U_{Soll1}$ or $U_{Soll2}$ and its own desired current value $I_{Soll1}$ or $I_{Soll2}$ are specified to each controller $S_1$ or $S_2$ for a voltage and a current regulation. In the example in accordance with FIG. 3 the first controller $S_1$ of the first converter unit W1 is defined as master and the second controller $S_2$ of the second converter unit W2 functions as slave.

The two outputs $OUT_1$, $OUT_2$ of the two converters W1, W2 can be connected in parallel using a connecting piece VS. In this case, attaching the connecting piece VS activates an auxiliary contact HK, which is connected to the second controller $S_2$. In this way, the second controller $S_2$ receives a recognition signal as to whether a parallel connection is in place. To evaluate the recognition signal, the second controller $S_2$ has a supervision unit. As soon as the second controller $S_2$ detects a parallel connection, there is a switchover, using electronically-controlled switches, from its own desired values $U_{Soll2}$, $I_{Soll2}$ to the desired values $U_{Soll1}$ $I_{Soll1}$ of the master controller $S_1$.

Figure 4:
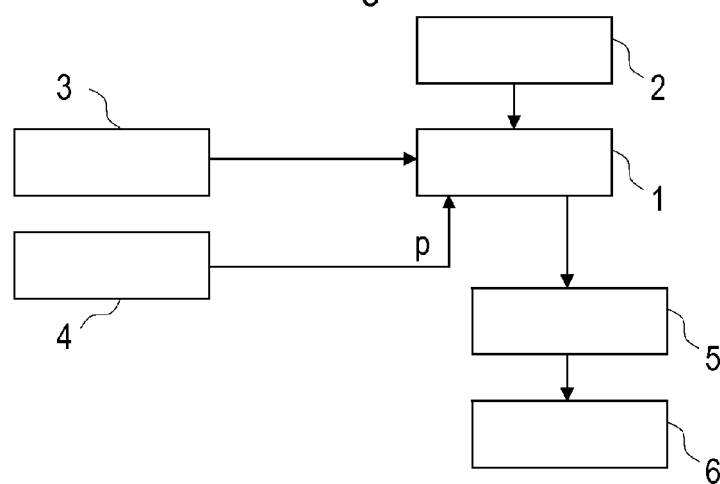
FIG. 4 shows signal processing in a controller embodied as a slave in accordance with one embodiment of the present invention.

The signal sequence of this process is shown in FIG. 4. A switchover device 1, which is activated by or included in the controller $S_2$ implemented as a slave, is supplied with both its own desired values $U_{Soll2}$, $I_{Soll2}$ and also the desired values $U_{Soll1}$, $I_{Soll1}$ of the master controller $S_1$. Using supervision unit 4, it is determined during a start-up process or in the ongoing operation whether a parallel connection is present. In this case, a corresponding result signal p is supplied to the switchover device 1. Depending on whether a parallel connection was recognized, the corresponding desired values $U_{Soll1}$, $I_{Soll1}$ or $U_{Soll2}$, $I_{Soll2}$ are predetermined at the power part 5 of the converter unit W2 belonging to the controller $S_2$. The desired output voltage $U_2$ is then present at output 6.

Figure 5:
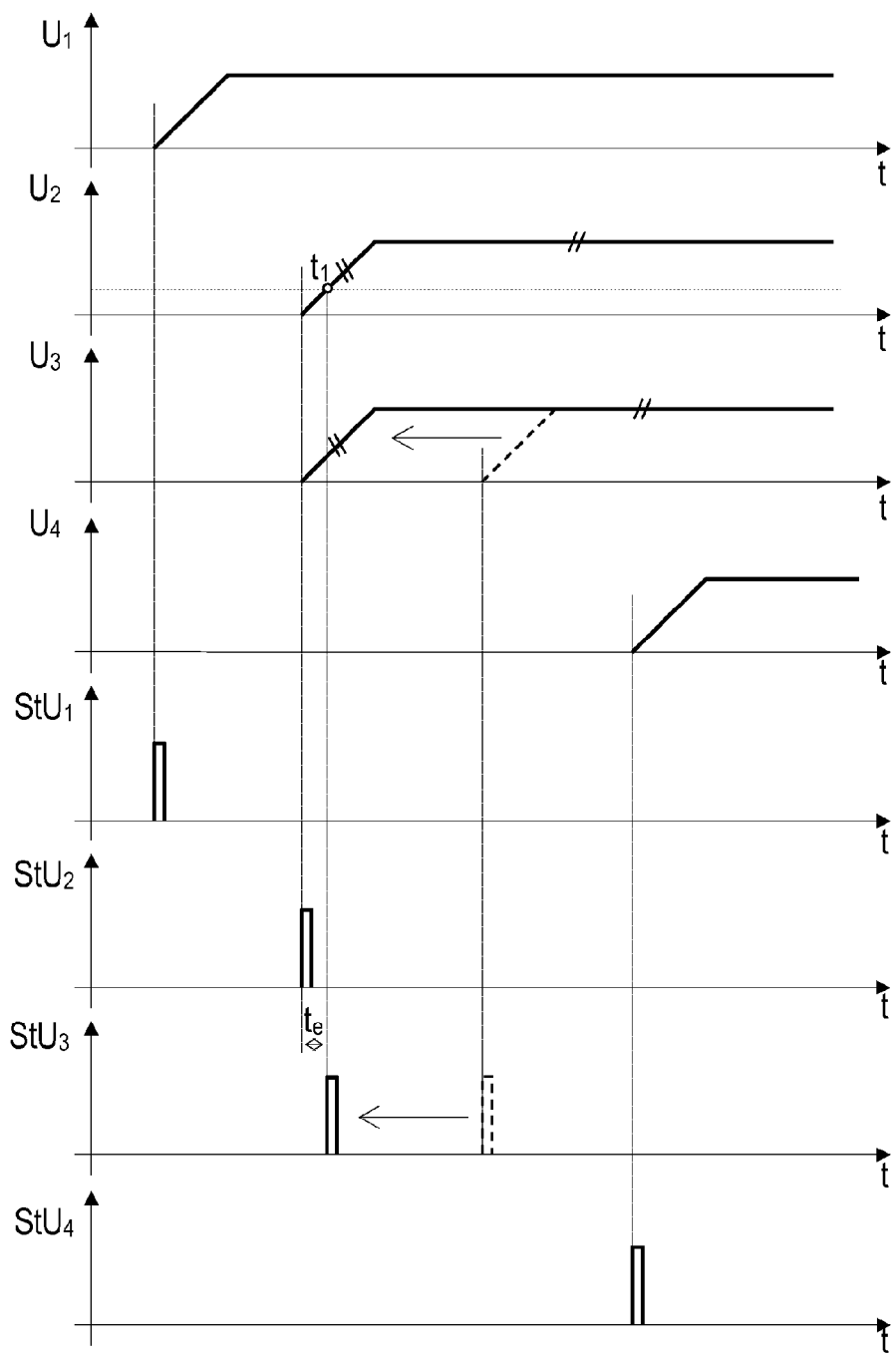
FIG. 5 shows voltage and current curves on recognition of a parallel connection during a start-up process in accordance with one embodiment of the present invention.

To recognize a parallel connection during a start-up, a number of converter units are activated one after another. The corresponding voltage and signal curves for four converter units are shown in FIG. 5. The start signals $StU_1$, $StU_2$, $StU_3$, $StU_4$ for starting up the individual converter units, have a time interval from one another. During the start-up of the first converter unit the output voltage $U_1$ at the first output increases with a ramp up to the predetermined desired voltage. In the other converter units, the voltage at the respective output is supervised during this period. If no voltage changes are produced, the second converter unit is started up. While the voltage $U_2$ at the output of the second converter unit increases, after a recognition time $t_e$, at time $t_1$ it is recognized that the voltage $U_3$ at the output of the first converter unit is also increasing. From this, it is concluded in the supervision unit that the outputs of the second and third converter unit are connected in parallel. The start of the third converter unit is therefore brought forward in relation to the time shown by a dashed line. Lastly the fourth converter unit is started up.

The switching on of loads with very high capacitance is equivalent in a first switch-on phase to a short-circuit. Therefore, it is advantageous in such case to also continue the checking of the synchronism of the output voltages if a short-circuit is recognized when an output is switched on. If as a result of the predetermined wait time, the next output is activated and the result of the voltage supervision likewise shows a short-circuit, then there is the possibility that both outputs are connected to a very large capacitor. The synchronism of the output voltages can thus only be uniquely detected when the charging of a load capacitor up to a predefined voltage value has taken place. This predefined voltage value advantageously lies far above the sum of all evaluation tolerances of the individual output voltages.

Figure 6:
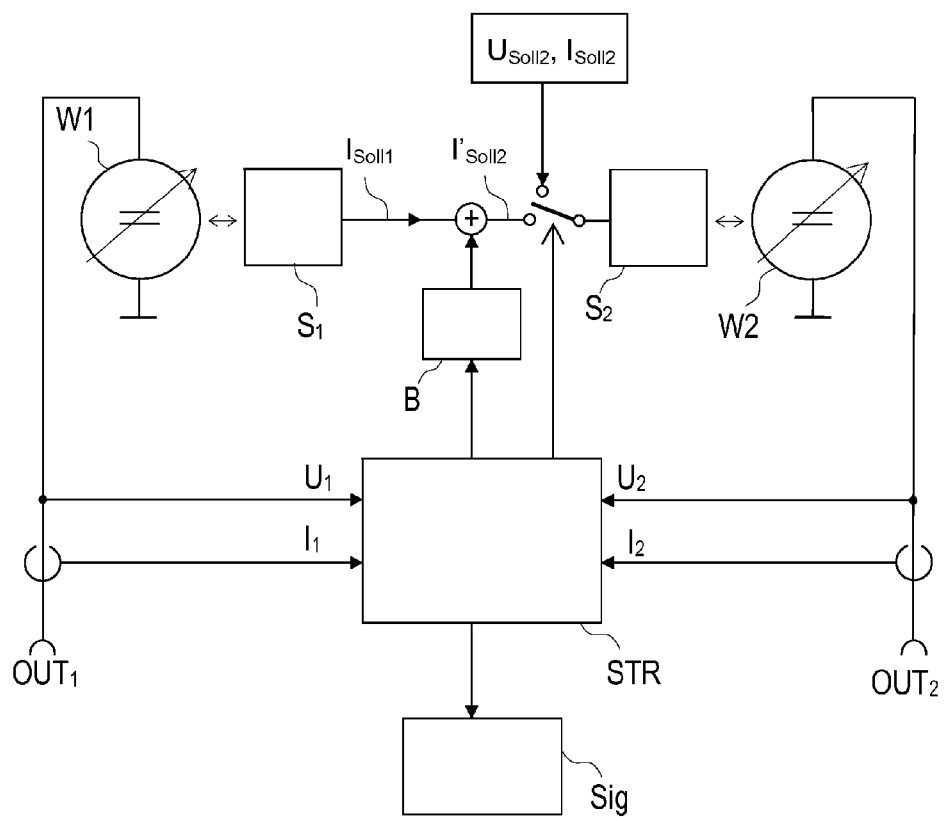
FIG. 6 shows two converter units with automatic parallel connection recognition using a higher-ranking controller in accordance with one embodiment of the present invention.

FIG. 6 shows two converter units W1, W2 which can be connected together with a higher-ranking controller STR. The higher-ranking controller STR is supplied with the actual values of the voltages $U_1$, $U_2$ and the currents $I_1$, $I_2$ at the outputs $OUT_1$, $OUT_2$ of the converter units W1, W2. Depending on whether a parallel connection is present, the second controller $S_2$ implemented as slave is supplied with its own desired values $U_{Soll2}$, $I_{Soll2}$ of the desired values $U_{Soll1}$, $I_{Soll1}$ of the master controller $S_1$. This switchover is undertaken using higher-ranking controller STR, wherein the desired values $U_{Soll1}$, $I_{Soll1}$ of the master controller $S_1$ are modified using desired value influencing B. For example, the second controller $S_2$ can thus briefly be supplied with a modified desired current value $\dot{I}_{Soll2}$ in order to verify an assumed parallel connection.

In addition, the higher-ranking controller STR is connected to a signaling unit Sig for transmission of data to a plant control system. Signal curves for verifying a parallel connection by briefly changing the desired current value $\dot{I}_{Soll2}$ for the second controller $S_2$ are shown in FIGS. 7 and 8.

Figure 7:
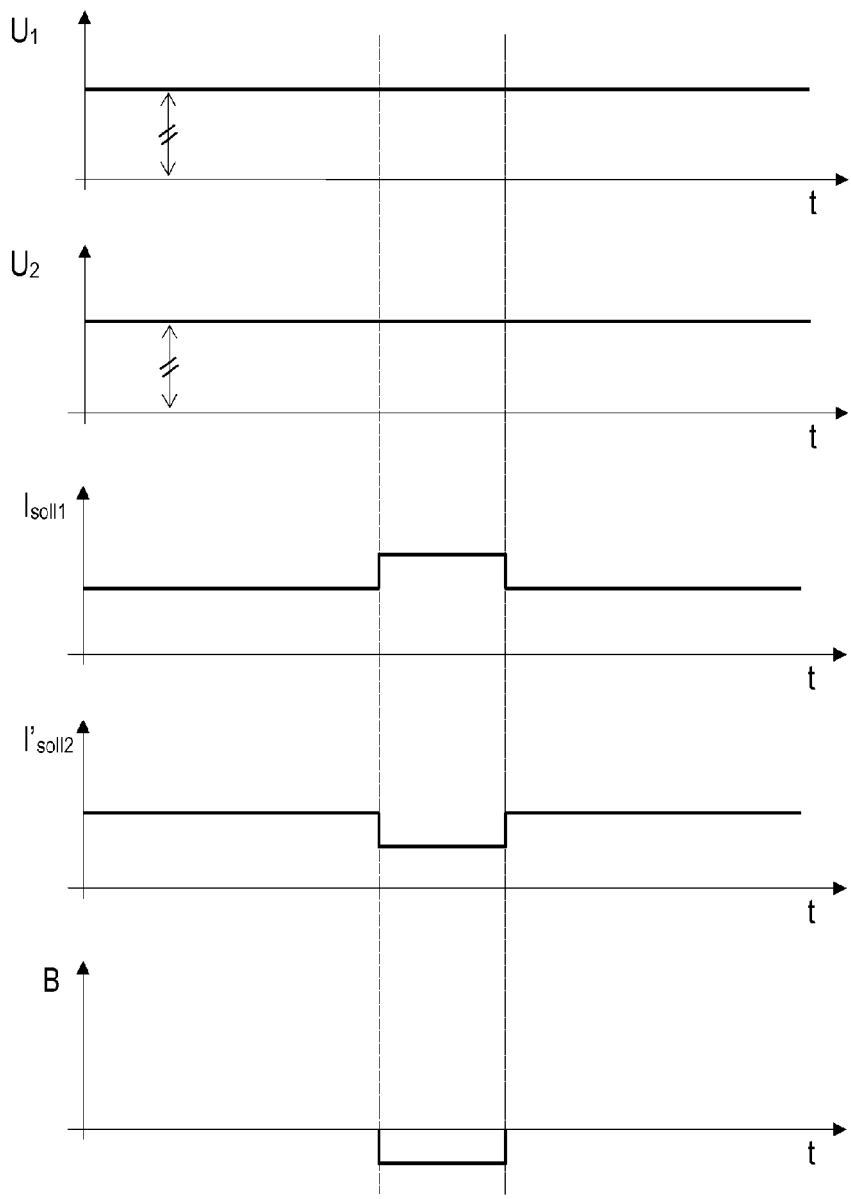
FIG. 7 shows voltage and current curves with briefly changed desired current value of a converter unit and parallel-connected outputs in accordance with one embodiment of the present invention.

FIG. 7 shows the curves for parallel-connected outputs. Using desired value influencing B, the desired current value $\dot{I}_{Soll2}$ is briefly reduced for the second controller $S_2$. The two voltages $U_1$, $U_2$ at the two outputs remain the same, wherein the first converter unit W1, as a result of a slightly falling output voltage from the voltage regulator of the controller $S_1$, will have a higher desired current value $I_{Soll1}$ predetermined to it in order to maintain the voltage level. The evaluation of the regulator reaction leads to the conclusion of whether a parallel circuit is present or not.

Figure 8:
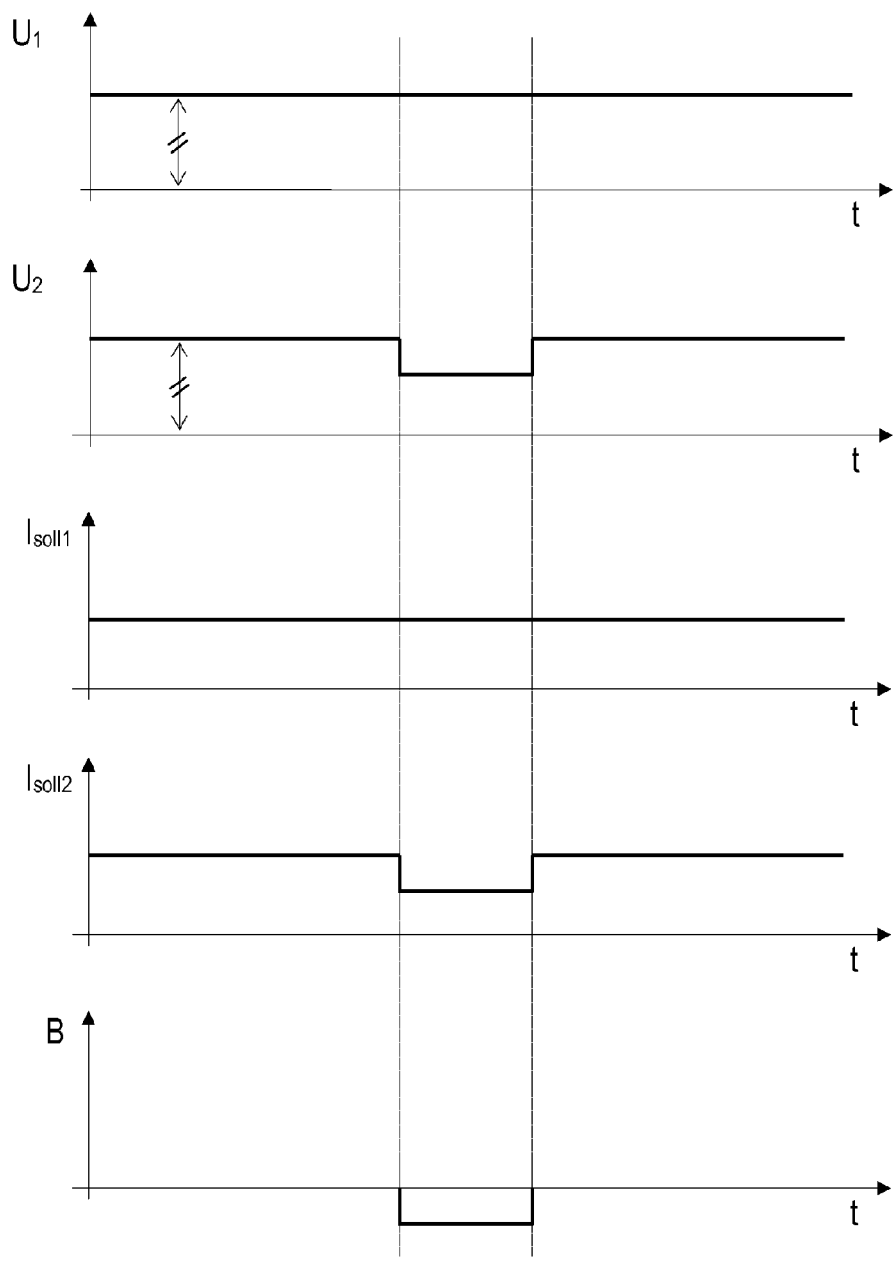
FIG. 8 shows voltage and current curves with briefly changed desired current value of a converter unit without parallel-connected outputs in accordance with one embodiment of the present invention.

It behaves differently if no parallel connection is present, as shown in FIG. 8. A brief drop in the desired current value $\dot{I}_{Soll2}$ for the second controller $S_2$ merely leads to the current $U_2$ also falling at the output of the second converter unit W2. The voltage $U_1$ and the desired current value $I_{Soll1}$ of the first converter unit W1 remain uninfluenced.

Figure 9:
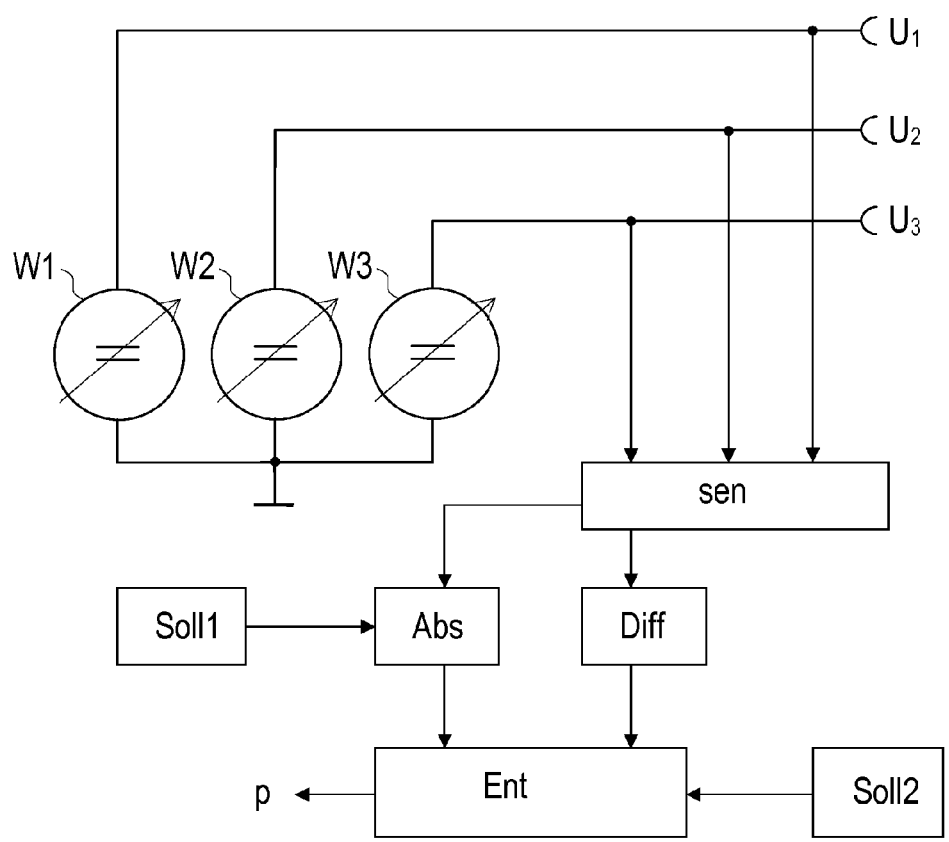
FIG. 9 shows three converter units with parallel connection recognition in accordance with one embodiment of the present invention.

FIG. 9 shows a structure with three converter units W1, W2, W3. Three voltages $U_1$, $U_2$, $U_3$, which are detected with a sensor unit sen, are present at the outputs. A first evaluation logic Abs evaluates a change of the absolute voltage values, while a second evaluation logic Diff evaluates changes to the differences of these voltage values. The first evaluation logic Abs in particular supervises the voltages at the outputs during the start-up of a power supply unit. The first evaluation logic Abs is supplied with desired values Soll1 as limit values. The decision is made as to whether a parallel connection is present or not based on the limit values. A predetermined minimum voltage prevents from recognizing a synchronism of two or more converter units that are not unique with absolute values that are too low as a result of evaluation tolerances. The predetermined minimum voltage also prevents from drawing a false conclusion.

The results of the two evaluation logics Abs, Diff are supplied to a decision logic Ent, which decides on the basis of the criteria explained above whether a parallel connection is present. In this case, desired values Soll2 are received with the limit values for a maximum tolerance of differential voltages. In the event of a parallel connection, a result signal p is output.

Figure 10:
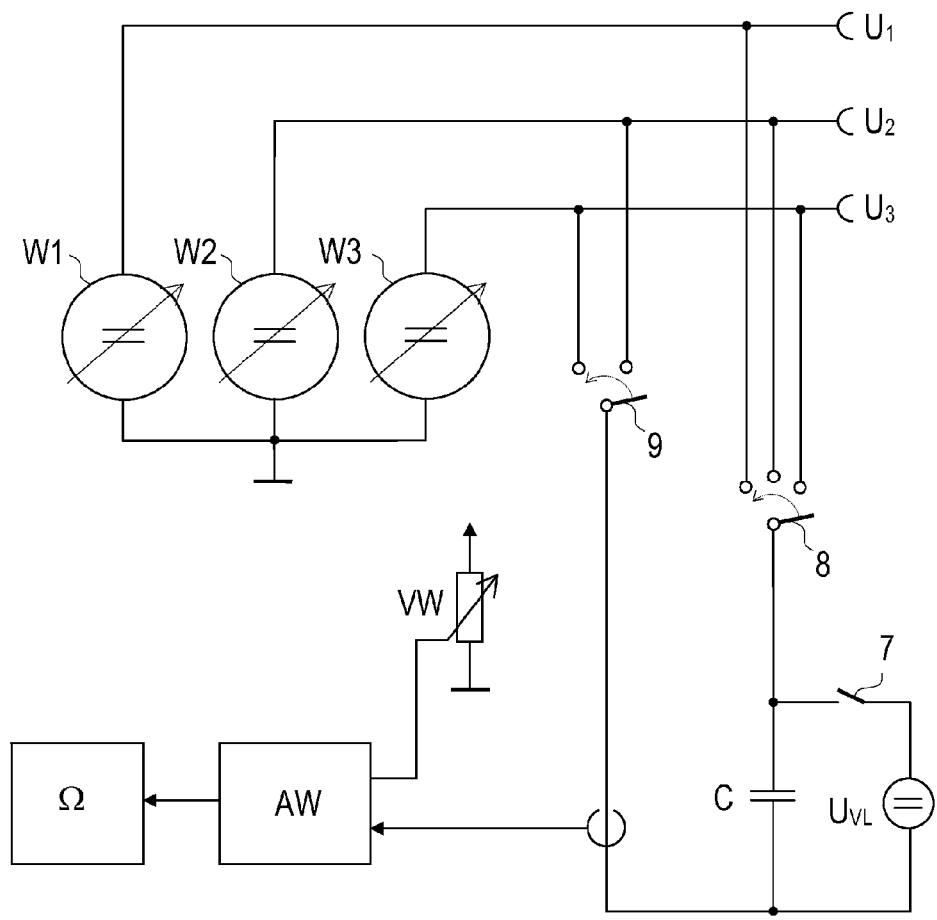
FIG. 10 shows an arrangement for parallel connection recognition during operation by injecting a current in accordance with one embodiment of the present invention.

A circuit arrangement for recognizing a parallel connection during operation by injecting a current is shown in FIG. 10. The power supply unit again comprises three converter units W1, W2, W3. A capacitor C is charged up via a switch 7 to the voltage of an auxiliary supply $U_{VL}$. Then there is a sequential connection of the capacitor voltage to two outputs in each case in turn using two multi-pole switches 8, 9 or to a switch arrangement of tailored switches, wherein a charging of the capacitor C is repeatedly undertaken in the interim.

While the capacitor voltage is being applied to two outputs, a discharge current of the capacitor C is detected and supplied to an evaluation unit AW. This evaluation unit AW compares the detected discharge current with a predetermined value VW and outputs a notification signal Ω which indicates whether a connection between two outputs is low-resistance or high-resistance. A parallel connection is assumed for a low-resistance connection. The predetermined value VW in this case is advantageously set so that, taking into consideration the internal resistances of the output capacitors of the individual converter units, a minimal current must flow for a minimal time out of the capacitor C, before, in the event of there being no parallel connection, a voltage change is measured at the outputs.

Figure 11:
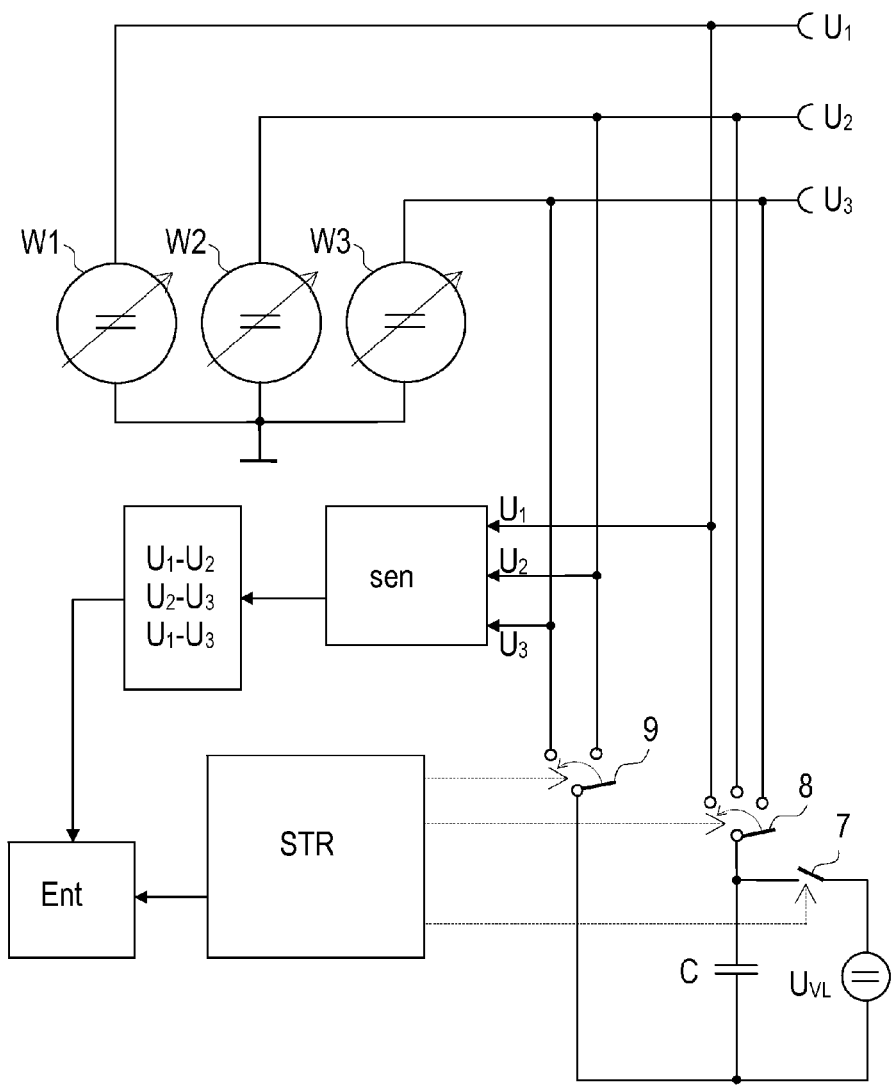
FIG. 11 shows a simplified arrangement for parallel connection recognition during operation by injecting a current in accordance with one embodiment of the present invention.

A method with reduced complexity is applicable if the outputs of the converter units W1, W2, W3 do not have any low-resistance output capacitors (FIG. 11). As explained for FIG. 10, a capacitor voltage is applied to each of two outputs in a sequence. The switches 7, 8, 9 in this case are activated using a higher-ranking controller.

During this process, the voltages $U_1$, $U_2$, $U_3$ at the outputs of the converter units W1, W2, W3 are detected and supplied via a sensor unit sen and a differentiator $U_1$-$U_2$, $U_2$-$U_3$, $U_1$-$U_3$ to an evaluation logic Diff. In the differentiator $U_1$-$U_2$, $U_2$-$U_3$, $U_1$-$U_3$, all voltage differences between the individual outputs are determined. A downstream decision logic Ent evaluates whether a parallel connection is present between two outputs. For this purpose, the decision logic Ent receives synchronous switching data of the switches 8, 9 from the higher-ranking controller STR, in order to assign the evaluated voltages $U_1$, $U_2$, $U_3$ to the individual outputs.

Figure 12:
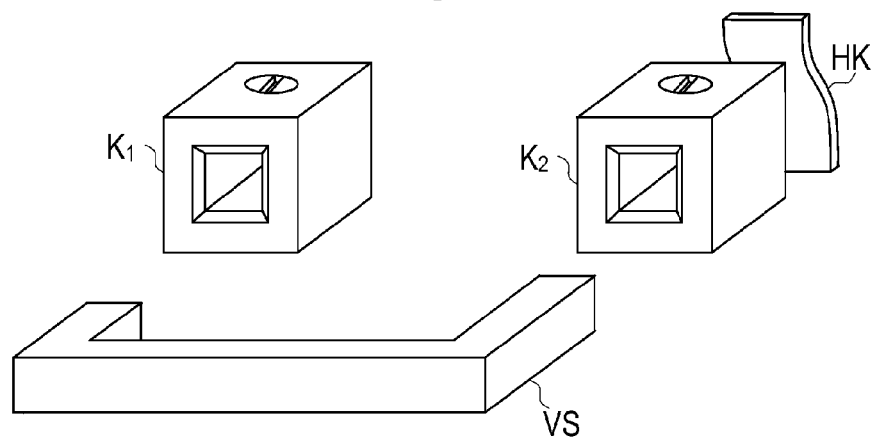
FIG. 12 shows a mechanical connection of two outputs using a connecting piece in accordance with one embodiment of the present invention.

FIG. 12, shows an arrangement with a connecting piece VS, which connects two output terminals $K_1$, $K_2$. The connecting piece VS is advantageously made of copper and in this example has a curved shape. Disposed behind the second output terminal $K_2$ is an auxiliary contact HK. In its inserted state, the connecting piece VS is connected electrically-conductively to this auxiliary contact HK, through which a recognition signal present at the auxiliary contact HK changes its signal state. Specifically, there is a potential forwarding of the power connection to the auxiliary contact HK.

Figure 13:
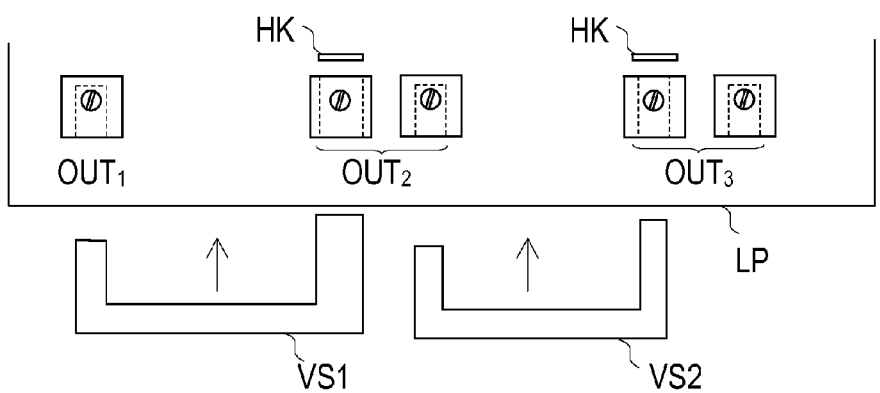
FIG. 13 shows an arrangement of three outputs with auxiliary contacts and two connecting pieces in accordance with one embodiment of the present invention.

In FIG. 13, the circuit board LP with three converter outputs $OUT_1$, $OUT_2$, $OUT_3$ is shown. The first converter output $OUT_1$ has one output terminal, while the two outputs OUT$_2$, OUT$_3$ each have two output terminals. For connecting the outputs OUT$_1$, OUT$_2$ or OUT$_2$, OUT$_3$, differently-shaped connecting pieces VS1, VS2 are provided so that only precisely defined outputs OUT$_1$, OUT$_2$ or OUT$_2$, OUT$_3$ are connected to one another.

Figure 14:
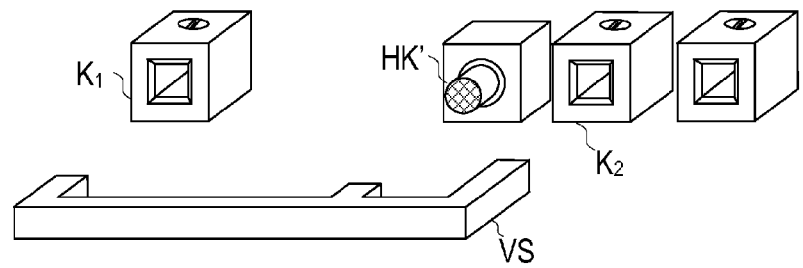
FIG. 14 shows a mechanical connection of two outputs using a connecting piece and an actuation element in accordance with one embodiment of the present invention.

FIG. 14 shows a terminal arrangement with an actuation element HK̇. The auxiliary contact for changing the recognition signal is influenced with this actuation element HK̇. Where two terminals K1, K2 are connected using a connecting piece Vn, this connecting piece VS automatically actuates the actuation element, through which a parallel connection is signaled.

Alternatively, the actuation element HK̇ can be implemented as a magnetic field-sensitive switch (for example a reed relay). In this case, a magnet is disposed in the connecting piece VS at the point which, in the event that a parallel connection of the outputs is made using connecting piece VS, activates the magnetic sensor. In the arrangement of two or more sensors, different embodiments of the connecting pieces VS can be recognized. This might be of advantage if a modified connection piece VS connects more than two outputs which are not placed directly next to one another. Such a multiple connection demands a different master-slave assignment of the controllers to a connection of two outputs using a simple connecting piece VS.

Figure 15:
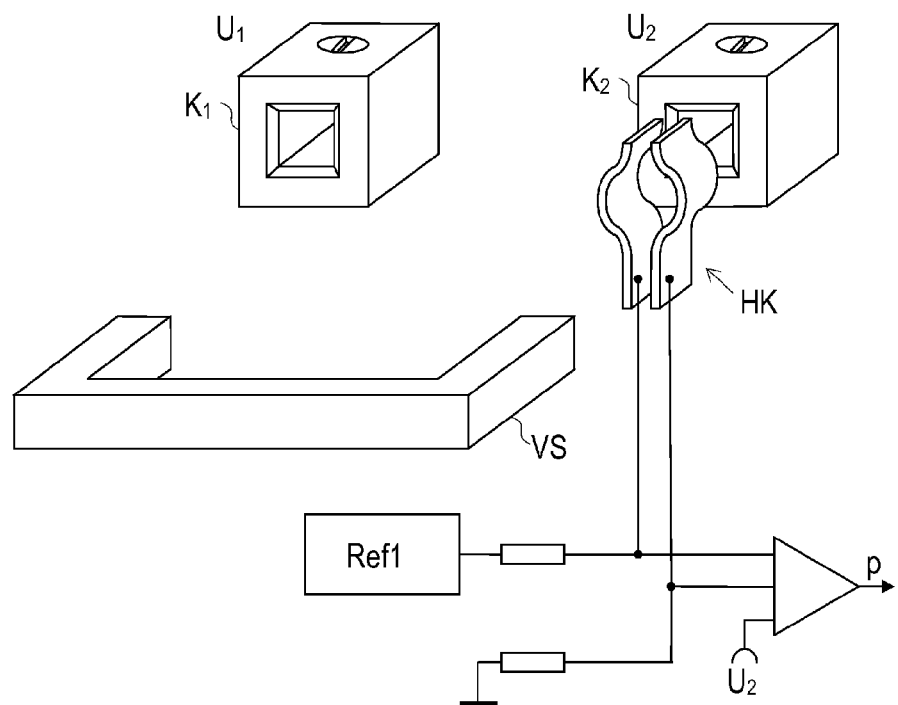
FIG. 15 shows a mechanical connection of two outputs using a connecting piece and an auxiliary contact with signal unit in accordance with one embodiment of the present invention.

A variant for detecting a parallel connection even before the contacting of the power outputs is shown in FIG. 15. Two terminals K$_1$, K$_2$ are again connected using a connecting piece VS. An auxiliary contact HK is disposed in front of a receptacle opening of the second terminal K$_2$. In addition, the auxiliary contact HK comprises two single contacts which are short-circuited using connecting piece VS.

An individual contact is set to a reference voltage Ref1. The other individual contact is connected to ground via a pull-down. A connection of the two individual contacts using connecting piece VS is established by a comparator. If the connecting piece VS is pushed into the terminal K$_2$ so that a connection with the second output voltage U2 is also present, both individual contacts have the potential of this output voltage U$_2$. In a comparator, to which the second output voltage U$_2$ is likewise supplied, this change is also detected, which ensures that the correct connecting piece VS has been plugged into the terminal K$_2$.

FIG. 16 shows an arrangement with a microswitch HK̇ which is disposed in front of a terminal K$_1$. This microswitch HK̇ is placed in such a way that, on insertion of a connecting piece VS, contact between connecting piece VS and microswitch HK̇ is unavoidable.

For parallel connection known as double terminals are also used if the terminals are modified accordingly. Such double terminals are disposed in a common housing. In the housing, a slot extends over the width of the two terminals into which sprung connections of the two terminals project. The terminal contacts are connected by a connecting leaf being pushed into the slot. For the present invention, an auxiliary contact for influencing a recognition signal is also provided in the slot.

All embodiments which are described in relation to two, three or four converter units apply in the same way to more converter units. The checking arrangements are then to be expanded appropriately and the checking methods are to be carried out sequentially for all possible parallel connections of the individual outputs.

Although the present invention has been described above with reference to presently preferred embodiments, it is not limited thereto but rather can be modified in a wide variety of ways. In particular, the invention can be altered or modified in multifarious ways without departing from the essence of the invention.

The invention claimed is:

1. A power supply unit, comprising:
at least one first converter unit controlled with a first controller, said at least one first converter unit supplying, at a first output, at least one of (i) a first output voltage which is regulated via a first voltage regulator and (ii) an output current which is regulated via a first current regulator; and
at least one second convertor unit controlled by a second controller, said at least one second convertor unit supplying, at a second output, at least one of (i) a second output voltage which is regulated via a second voltage regulator and (ii) a second output current which is regulated via a second current regulator;
wherein the first and second outputs are connected in parallel to provide a higher output power;
wherein at least one of the first and second controllers includes a supervision unit for recognizing an output-side parallel connection,
wherein the supervision unit is supplied with a recognition signal, which for parallel-switched outputs, automatically changes its signal state; and
wherein, for a recognized parallel connection, the first and second voltage regulators and the first and second current regulators are coupled by predetermining desired voltage values or current values that are matched to one another.

2. The power supply unit of claim 1, wherein the desired voltage values are predetermined as a common desired voltage value.

3. The power supply unit of claim 2, wherein each current regulator is subordinate to the coupled first and second voltage regulators.

4. The power supply unit of claim 1, wherein the desired current values are predetermined as a common desired current value.

5. The power supply unit of claim 1, wherein the at least one first and second controllers each include a current regulator for regulating a current flowing via a corresponding assigned output.

6. The power supply unit of claim 1, wherein one of the at least one first and second controllers is configured as a master; and wherein another of the at least one first and second controllers takes over as a slave desired values of the master upon recognition of a parallel connection.

7. The power supply unit of claim 6, wherein, when the first and second outputs are connected via the connecting piece, one of (i) a mechanical (ii) electromagnetic sensor is activated.

8. The power supply unit of claim 1, wherein one of the at least one first and second controllers is configured as a master; and wherein another of the at least one first and second controllers takes over as a slave one of (i) switch-on and switch-off times and (ii) switch-on and switch-off points in time of the master upon recognition of a parallel connection.

9. The power supply unit of claim 1, wherein the first and second outputs are connected via a connecting piece; and wherein the connecting piece is mechanically coupled to an electric auxiliary contact to influence the recognition signal.

10. The power supply unit of claim 9, wherein, for more than two outputs, the dimensions of the connecting piece and the first and second outputs are predetermined such that only specific outputs are connected via the connecting piece.

11. The power supply unit of claim 9, wherein, when the first and second outputs are unconnected, an electric auxiliary contact is open or closed and, when the first and second outputs are connected via the connecting piece, the electric auxiliary contact is closed or opened.

12. The power supply unit of claim 9, wherein, when the first and second outputs are connected via the connecting piece, an electromechanical actuation element is actuated.

13. The power supply unit of claim 1, further comprising:
a higher-ranking controller that includes a supervision unit for recognizing an output-side parallel connection;
wherein the higher-ranking controller is connected to the at least one first and second controllers of the at least one first and second converter units.

14. A method for operating a power supply unit, comprising:
controlling, by a first controller, at least one first converter unit to supply, at a first output, at least one of (i) a first output voltage which is regulated via a first voltage regulator and (ii) an output current which is regulated via a first current regulator;
controlling, by a second controller, at least one second converter unit to output, at a second output, at least one of (i) a second output voltage which is regulated via a second voltage regulator and (ii) a second output current which is regulated via a second current regulator;
wherein the first and second outputs are connected in parallel to provide a higher output power;
wherein at least one of the first and second controllers includes a supervision unit for recognizing an output-side parallel connection;
wherein the supervision unit is supplied with a recognition signal, which for parallel-switched outputs, automatically changes its signal state; and
wherein, for a recognized parallel connection, the first and second voltage regulators and the first and second current regulator are coupled by predetermining desired voltage values or current values that are matched to one another.

15. The method of claim 14, wherein, when the first and second outputs are connected via a connecting piece, an auxiliary contact is additionally opened or closed via the connecting piece.

16. The method of claim 14, wherein, during a startup process of the power supply unit, a parallel connection of the first and second outputs is checked, the at least one first converter unit being started up first, and the output voltage being detected as the recognition signal at the output of the at least one second converter unit during said start-up.

17. The method of claim 14, wherein the at least one first and second converter units are each controlled via a current regulator; and wherein during ongoing operation a briefly changed desired voltage value is predetermined to the current regulator and during this process a difference between the first and second output voltages is detected as the recognition signal.

18. The method of claim 14, wherein the at least one first and second converter units are each controlled via a current regulator; and wherein during ongoing operation a briefly changed desired current value is predetermined to the current regulator and during this process an actual current value of another converter unit is detected as the recognition signal.

19. The method of claim 14, wherein current is injected between the first and second outputs via an additional voltage source; and wherein during this process a difference between the first and second output voltages is detected as the recognition signal.

20. The method of claim 14, wherein the at least one first and second converter units is controlled via a current regulator; and wherein a desired current value is briefly specified directly to one converter unit of the at least one first and second convertor units such that the one converter unit operates in a pure current source mode and such that a voltage at a corresponding output of the one converter unit is detected as the recognition signal.

21. The method of claim 20, wherein the directly predetermined desired current value corresponds to the desired current value of another converter unit of the at least one first and second converter units.

22. The method of claim 14, wherein a difference between the first and second output voltages is detected continuously, a recognition process for a possible parallel connection of the first and second outputs being initiated if said detected difference falls below a minimum value.

23. The method of claim 14, wherein an internal output voltage is detected for the at least one first and second converter units; and wherein a difference between said internal output voltages is compared with a predetermined maximum value if a parallel connection is recognized, one of (i) a switch-off of the power supply unit and (ii) an activation of a notification signal being performed if the maximum value is exceeded.

* * * * *